(12) United States Patent
Ding et al.

(10) Patent No.: US 9,960,735 B1
(45) Date of Patent: May 1, 2018

(54) MIXER OF A NEAR FIELD COMMUNICATION (NFC) RECEIVER DEVICE SUPPORTING SINGLE-ENDED AND DIFFERENTIAL INPUTS

(71) Applicant: NXP B.V., Eindhoven (NL)

(72) Inventors: Jingfeng Ding, Gratwein (AT); Helmut Kranabenter, Graz (AT); Gernot Hueber, Linz (AT)

(73) Assignee: NXP B.V., Eindhoven (NL)

( * ) Notice: Subject to any disclaimer, the term of this patent is extended or adjusted under 35 U.S.C. 154(b) by 0 days. days.

(21) Appl. No.: 15/341,629

(22) Filed: Nov. 2, 2016

(51) Int. Cl.
| | |
|---|---|
| *G06G 7/12* | (2006.01) |
| *H03D 7/12* | (2006.01) |
| *G11C 27/02* | (2006.01) |
| *H04B 5/00* | (2006.01) |

(52) U.S. Cl.
CPC ............ *H03D 7/125* (2013.01); *G11C 27/02* (2013.01); *H04B 5/0025* (2013.01); *H03D 2200/0082* (2013.01)

(58) Field of Classification Search
CPC .. H03D 2200/0082; H03D 7/125; H03D 7/08; H03D 7/1425; H03D 7/1433; H03D 7/1441; H03D 7/145; H03D 7/1458; H03D 7/1466; H03D 7/1475; H03D 7/1483; H03D 7/1491; H04B 5/0025; H04B 1/006; H04B 1/0082; H04B 1/403; G11C 27/02; G11C 27/022; G11C 27/024; G11C 27/026; G11C 27/028
USPC ......................................................... 327/355
See application file for complete search history.

(56) References Cited

U.S. PATENT DOCUMENTS

| | | | |
|---|---|---|---|
| 8,792,847 B2 * | 7/2014 | Gan ....................... | H03D 3/009 455/323 |
| 2006/0238301 A1 * | 10/2006 | Wu ....................... | G06K 7/0008 340/10.1 |
| 2016/0049913 A1 * | 2/2016 | Jussila ................. | H04B 1/0032 455/326 |

* cited by examiner

*Primary Examiner* — Patrick Chen

(57) ABSTRACT

Embodiments of a mixer of a Near field communication (NFC) receiver device and a method for operating a mixer of an NFC receiver device are disclosed. In an embodiment, a mixer of an NFC receiver device includes an input unit from which an input signal is received, a sample and hold circuit configured to sample the input signal and to store electrical charge based on the sampled input signal in order to generate a differential output signal, a control unit configured to switch the sample and hold circuit between different operational modes based on whether the input signal is a single-ended input signal or a differential input signal, and a differential output unit from which the differential output signal is output. Other embodiments are also described.

12 Claims, 13 Drawing Sheets

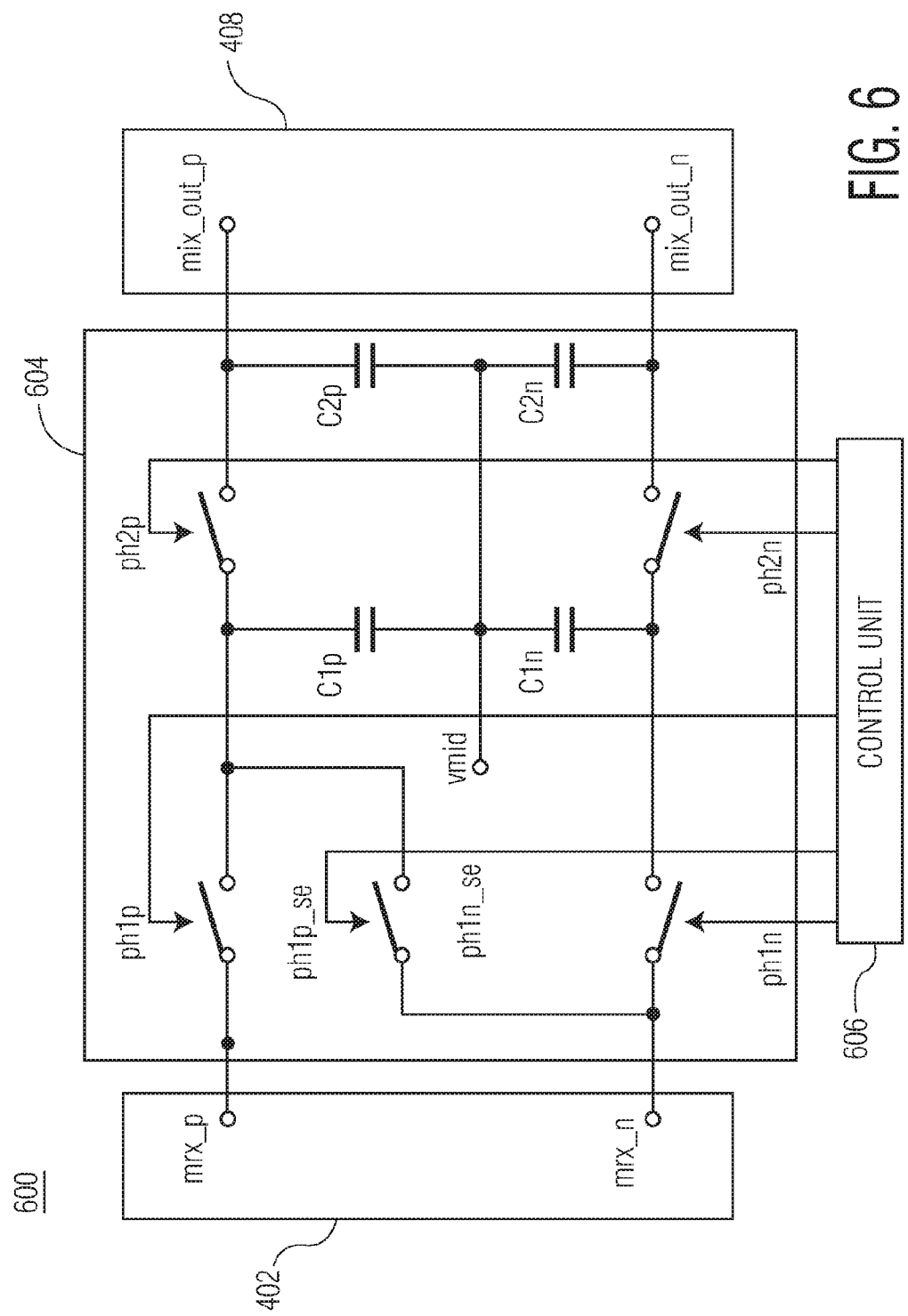

MIXER OF A NEAR FIELD COMMUNICATION (NFC) RECEIVER DEVICE SUPPORTING SINGLE-ENDED AND DIFFERENTIAL INPUTS

BACKGROUND

Near field communication (NFC) is a wireless technology based on radio frequency identification (RFID). NFC allows wireless connection between two devices in close proximity to each other to exchange data between the two devices. NFC also allows for a powered NFC device to generate an RF field to power a passive NFC target so that data stored in the passive NFC target can be read out. Passive NFC targets can have simple form factors, such as stickers, tags and cards. There are numerous uses for NFC devices. As an example, NFC tags can be used to provide information associated with posters to which the NFC tags are attached, such as webpage addresses.

Due to resource limitations in NFC devices, a single-ended antenna, which receives and outputs single-ended signals, may be used. For example, a GSM/UMTS antenna, which is usually single-ended, can be used in an NFC device. To support a single-ended antenna in an NFC device, a balanced-to-unbalanced transformer (BALUN) can be used. However, a BALUN typically requires costly components to be implemented on the substrate of an NFC device, which can increase the overall costs of material and the total substrate area for the NFC device.

SUMMARY

Embodiments of a mixer of a Near field communication (NFC) receiver device and a method for operating a mixer of an NFC receiver device are disclosed. In an embodiment, a mixer of an NFC receiver device includes an input unit from which an input signal is received, a sample and hold circuit configured to sample the input signal and to store electrical charge based on the sampled input signal in order to generate a differential output signal, a control unit configured to switch the sample and hold circuit between different operational modes based on whether the input signal is a single-ended input signal or a differential input signal, and a differential output unit from which the differential output signal is output. Other embodiments are also described.

In an embodiment, the control unit is configured to set the sample and hold circuit to a single-ended input operational mode in response to the input signal being a single-ended input signal and to set the sample and hold circuit to a differential input operational mode in response to the input signal being a differential input signal. The input unit includes a first input terminal and a second input terminal, and the sample and hold circuit includes a first switch connected between the first input terminal and the second input terminal.

In an embodiment, the control unit is configured to control the first switch based on whether the input signal is a single-ended input signal or a differential input signal.

In an embodiment, the control unit is configured to switch the first switch on when in the single-ended input operational mode.

In an embodiment, the control unit is configured to switch the first switch off when in the differential input operational mode.

In an embodiment, the differential output unit includes a first output terminal and a second output terminal. The sample and hold circuit further includes a second set of switches and multiple capacitors connected between the first and second input terminals and the first and second output terminals.

In an embodiment, the second set of switches includes a second switch, a third switch, a fourth switch, and a fifth switch. The capacitors include a first capacitor, a second capacitor, a third capacitor, and a fourth capacitor. The second switch is connected to the first input terminal and to the first capacitor, and the third switch is connected to the second input terminal and to the second capacitor.

In an embodiment, a first terminal of the first switch is connected to the first input terminal and to the second switch, a second terminal of the first switch is connected to the third switch and to the second capacitor, and the control unit is configured to switch the second switch off in response to the input signal being a single-ended input signal.

In an embodiment, the fourth switch is connected to the second switch, to the first capacitor, and to the first output terminal. The fifth switch is connected to the third switch, to the second capacitor, to the fourth capacitor, and to the second output terminal.

In an embodiment, the mixer further includes a sixth switch. A first terminal of the sixth switch is connected to the second input terminal and to the third switch. A second terminal of the sixth switch is connected to the second switch and to the first capacitor.

In an embodiment, the first, second, third, and fourth capacitors are connected to a node. The second input terminal is connected to the node if the input signal is a single-ended input signal.

In an embodiment, the mixer is an in-phase mixer or a quadrature mixer of an I/Q mixer system.

In an embodiment, the NFC receiver device further includes the I/Q mixer system, an amplifier connected to the I/Q mixer system, an Analog to Digital Converter (ADC) connected to the amplifier, and a digital signal processor (DSP) connected to the ADC.

In an embodiment, a mixer of an NFC receiver device includes a first input terminal and a second input terminal from which an input signal is received, a sample and hold circuit configured to sample the input signal and to store electrical charge based on the sampled input signal in order to generate a differential output signal, a control unit, and a first output terminal and a second output terminal from which the differential output signal is output. The sample and hold circuit includes multiple switches and multiple capacitors. The control unit is configured to switch on or off a first switch of the switches that is connected between the first input terminal and the second input terminal based on whether the input signal is a single-ended input signal or a differential input signal.

In an embodiment, the control unit is configured to switch the first switch on in response to the input signal being a single-ended input signal and to switch the first switch off in response to the input signal being a differential input signal.

In an embodiment, the switches include a second switch, a third switch, a fourth switch, and a fifth switch. The capacitors include a first capacitor, a second capacitor, a third capacitor, and a fourth capacitor. The second switch is connected to the first input terminal and to the first capacitor. The third switch is connected to the second input terminal and to the second capacitor.

In an embodiment, a first terminal of the first switch is connected to the first input terminal and to the second switch. A second terminal of the first switch is connected to the third switch and to the second capacitor. The control unit is configured to switch the second switch off in response to the input signal being a single-ended input signal.

In an embodiment, the fourth switch is connected to the second switch, to the first capacitor, to the third switch, and to the first output terminal. The fifth switch is connected to the third switch, to the second capacitor, to the fourth capacitor, and to the second output terminal.

In an embodiment, the mixer is an in-phase mixer or a quadrature mixer of an I/Q mixer system.

In an embodiment, a method for operating a mixer of an NFC receiver device involves receiving an input signal from an input unit, sampling the input signal and storing electrical charge based on the sampled input signal in order to generate a differential output signal using a sample and hold circuit, switching the sample and hold circuit between different operational modes based on whether the input signal is a single-ended input signal or a differential input signal, and outputting the differential output signal from a differential output unit.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 6 depicts an embodiment of the mixer depicted in FIG. 1 in which a negative input terminal of the mixer is used for receiving single-ended input signals.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
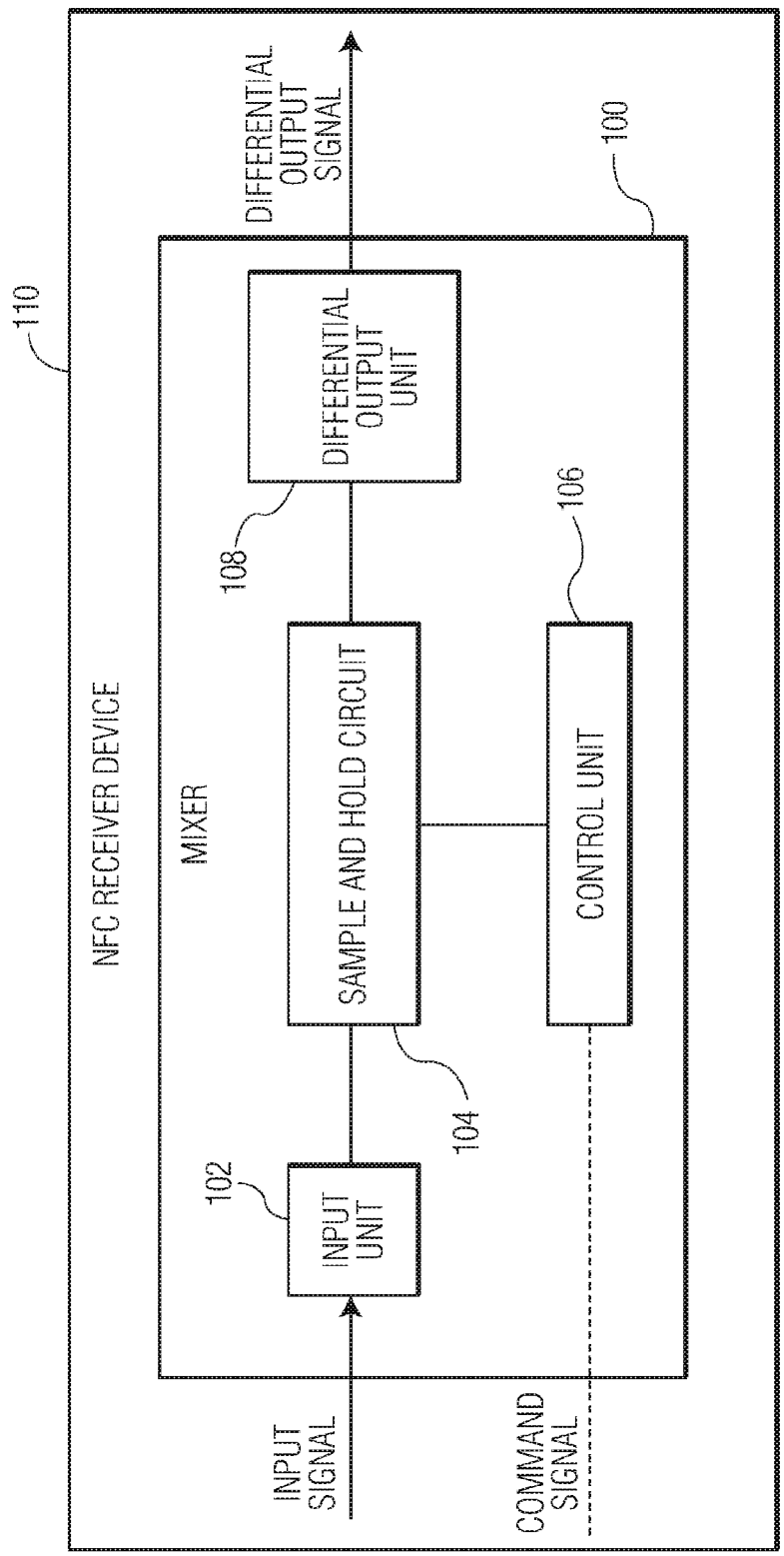
FIG. 1 depicts a mixer in accordance with an embodiment of the invention.

FIG. 1 depicts a mixer 100 in accordance with an embodiment of the invention. In the embodiment depicted in FIG. 1, the mixer includes an input unit 102, a sample and hold circuit 104, a control unit 106, and a differential output unit 108. The mixer is configured to process an input signal in the frequency domain (e.g., by mixing the input signal with a control/clock signal) to generate a differential output signal. The mixer may be an integrated circuit (IC) device, such as an IC chip. Although the illustrated mixer is shown with certain components and described with certain functionality herein, other embodiments of the mixer may include fewer or more components to implement the same, less, or more functionality.

The mixer depicted in FIG. 1 can be used in an NFC receiver device 110. In some embodiments, the NFC receiver device is implemented in a mobile device, such as a mobile phone. Because of the limited substrate (e.g., PCB) area of a mobile device, one or more components (e.g., the antenna) of the mobile device may be shared by other components of the mobile device. For example, Bluetooth and WLAN components may share the same antenna. Typically, the NFC receiver device is built with a mixer first topology because the NFC receiver device generally works in a short range and operates in a relative low operating frequency (e.g., around 13.56M Hz). For example, typically there is not a low noise amplifier (LNA) between the mixer and a corresponding antenna that is connected to the input terminals/pins, rx_p, and, rx_n, of the NFC receiver device. Consequently, the mixer may receive single-ended input signals as well as differential input signals. In the embodiment depicted in FIG. 1, the mixer 100 combines the functions of a single-ended mixer and a differential mixer together and can support both single-ended inputs and differential inputs. The mixer can switch between different operational modes and support both single-ended and differential input signals received at the NFC receiver device. Consequently, the mixer enables the NFC receiver device to support both single-ended antenna applications and differential antenna applications.

The input unit 102 of the mixer 100 is used to receive an input signal. The input unit may be implemented as multiple input terminals/pins. The input signal may be a single-ended input signal or a differential input signal. The sample and hold circuit 104 is configured to sample the input signal and to store electrical charge based on the sampled input signal in order to generate a differential output signal. The sample and hold circuit may be implemented as a combination of switches and capacitors. The differential output unit 108 is used to output the differential output signal. The differential output unit may be implemented as multiple output terminals/pins.

The control unit 106 of the mixer 100 is configured to switch the sample and hold circuit between different operational modes based on whether the input signal is a single-ended input signal or a differential input signal. The control unit may be implemented as a combination of one or more clock sources and/or processors. For example, the control unit may be implemented as one or more oscillators/frequency synthesizers and/or microcontrollers. In some embodiments, the control unit includes at least one frequency divider, at least one clock delay buffer and logic circuits with differential input clocks, which are generated by one or more oscillators or frequency synthesizers. The control unit can switch the sample and hold circuit between a single-ended input operational mode and a differential input operational mode. When a single-ended input signal is received at the input unit, the control unit sets the sample and hold circuit to operate in the single-ended input operational mode and to generate a differential output signal based on the received single-ended input signal. In some embodiments, the sample and hold circuit includes a switch connected between input terminals of the input unit and the control unit switches/turns the switch on in response to the input signal being a single-ended input signal. When a differential input signal is received at the input unit, the control unit sets the sample and hold circuit to operate in the differential input operational mode and to generate a differential output signal based on the received differential input signal. The control unit may receive an external instruction command that instructs the control unit to set the sample and hold circuit to the single-ended input operational mode or to the differential input operational mode. Alternatively, the control unit may detect the input signal as being a differential input signal or a single-ended input signal itself and set the sample and hold circuit to the single-ended input operational mode or to the differential input operational mode.

Figure 2:
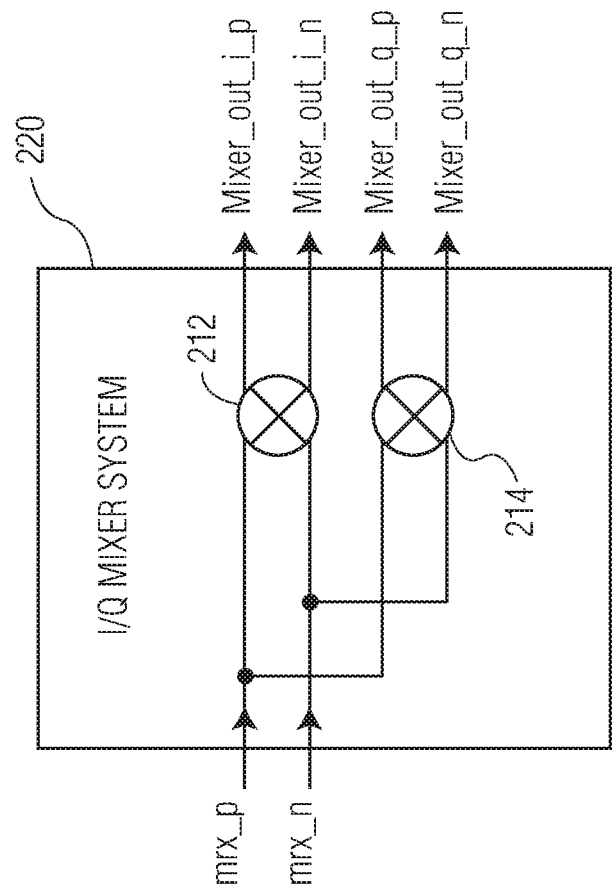
FIG. 2 depicts an embodiment of an in-phase/quadrature (I/Q) mixer system depicted in FIG. 1.

The mixer 100 depicted in FIG. 1 may be a standalone mixer or a component of a mixer system with multiple mixers. In some embodiments, the mixer is an in-phase mixer (I mixer) or a quadrature mixer (Q mixer) of an I/Q mixer system. FIG. 2 depicts an embodiment of an I/Q mixer system 220. In the embodiment depicted in FIG. 2, the I/Q mixer includes an I mixer 212 connected between input terminals, "mrx_p," "mrx_n," and output terminals, "Mixer_out_i_p, "Mixer_out_i_n," and a Q mixer 214 connected between the input terminals, mrx_p, mrx_n, and output terminals, "Mixer_out_q_p, "Mixer_out_q_n." Clock control signals for the I mixer and the Q mixer have a difference of 90 degrees. The I mixer or the Q mixer is an embodiment of the mixer 100 depicted in FIG. 1.

Figure 3:
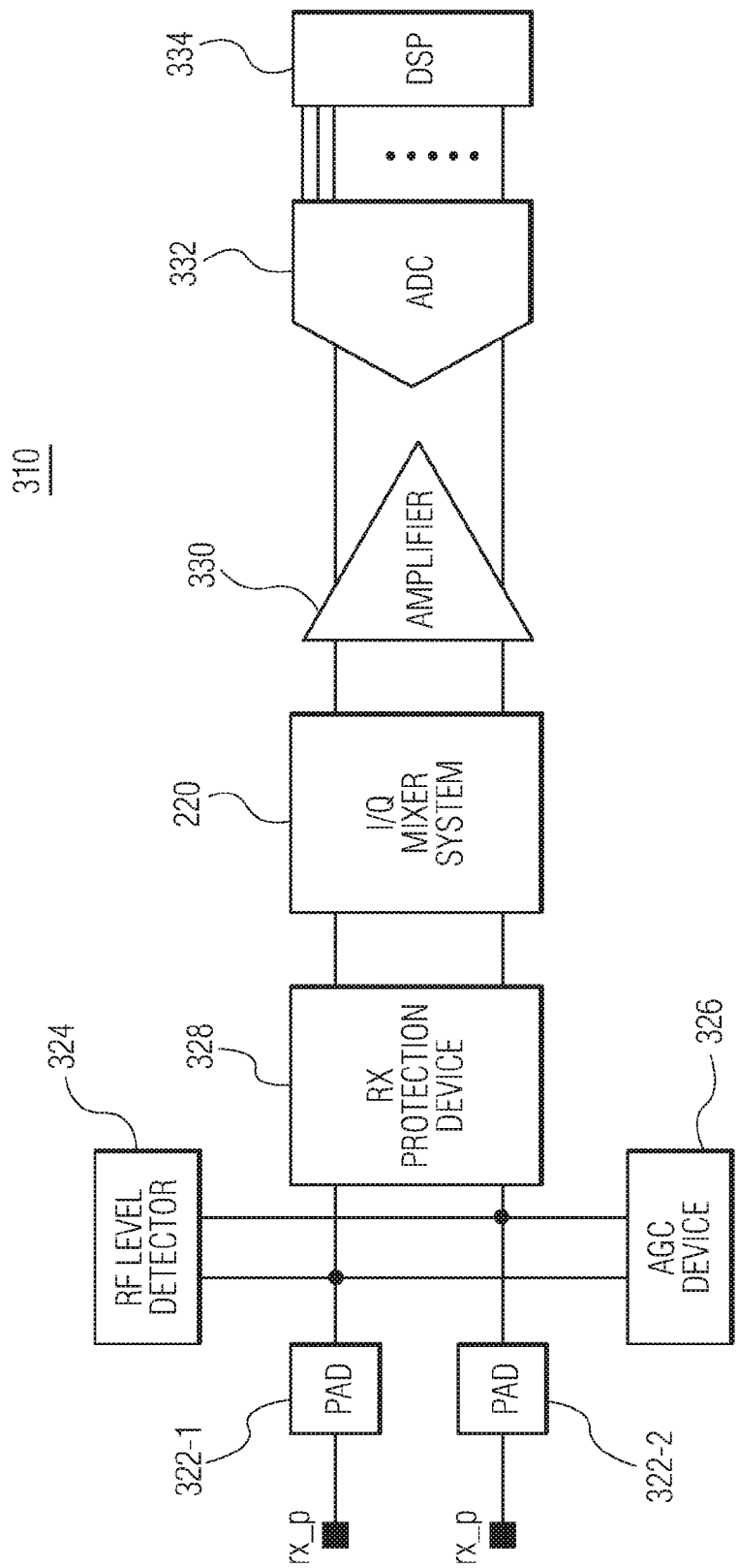
FIG. 3 depicts an embodiment of an NFC receiver device that includes the I/Q mixer system depicted in FIG. 2.

FIG. 3 depicts an embodiment of the NFC receiver device 110 depicted in FIG. 1 that includes the I/Q mixer system 220 depicted in FIG. 2. In the embodiment depicted in FIG. 2, an NFC receiver device 310 includes bonding pads 322-1, 322-2, an RF level detector 324, an Automatic Gain Control (AGC) device 326, a receiver (RX) protection device 328, the I/Q mixer system 220, an amplifier 330, an Analog to Digital Converter (ADC) 332, and a digital signal processor (DSP) 334. The NFC receiver device 310 depicted in FIG. 3 is one possible embodiment of the NFC receiver device 110 depicted in FIG. 1. However, the NFC receiver device 110 depicted in FIG. 1 is not limited to the embodiment shown in FIG. 3.

In the embodiment depicted in FIG. 3, the I/Q mixer system 220 is connected to input terminals/pins, "rx_p," and, "rx_n," of the NFC receiver device 310. Bonding pads 322-1, 332-2 are used as the input/output interface of the NFC receiver device. The RF level detector 324 is used to detect whether or not there is a field presented. With a signal of field present, the NFC receiver device is powered up. The AGC device 326 is used to regulate the field inducing input signal to a targeted value to achieve good sensitivity. The RX protection device 328 is used to protect other components (e.g., the I/Q mixer system) when there is a large field present. The amplifier 330 is connected to the I/Q mixer system and is used to amplify the baseband signal that is extracted by the I/Q mixer system from the incoming signal. The ADC 332 is connected to the amplifier and configured to convert the amplified signal from the amplifier into a digital signal. The DSP 334 is connected to the ADC and configured to process the digital signal to generate an output signal.

Figure 4:
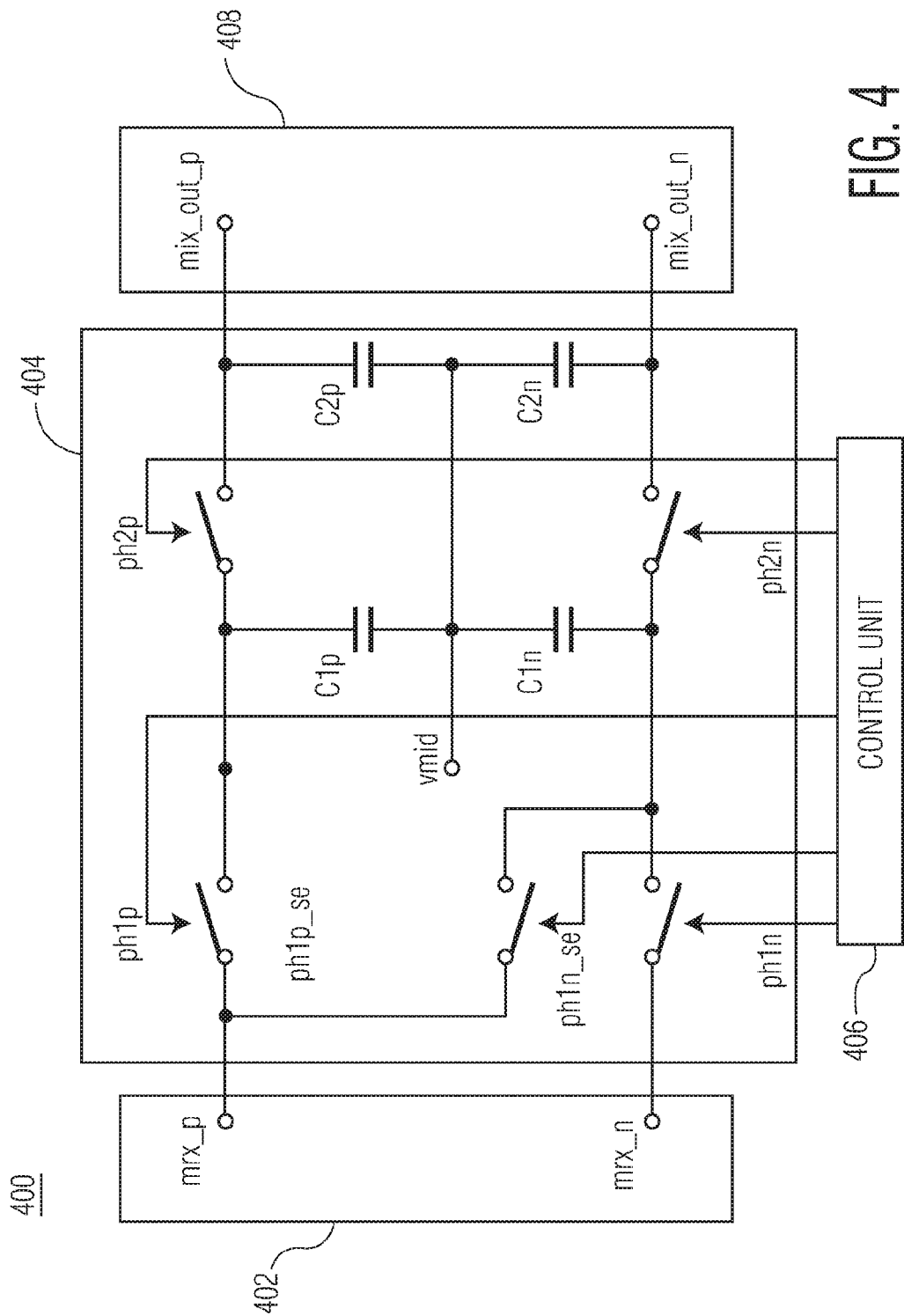
FIG. 4 depicts an embodiment of the mixer depicted in FIG. 1 in which a positive input terminal of the mixer is used for receiving single-ended input signals.

In some embodiments, a positive input terminal of the mixer 100 is used for receiving single-ended input signals. FIG. 4 depicts an embodiment of the mixer 100 depicted in FIG. 1 in which a positive input terminal, mrx_p, is used for receiving single-ended input signals. In the embodiment depicted in FIG. 4, a mixer 400 includes an input unit 402 having a positive input terminal, mrx_p, and a negative input terminal, "mrx_n," a sample and hold circuit 404, a control unit 406, and a differential output unit 408 having a positive output terminal, "mix_out_p," and a negative output terminal, "mix_out_n." The mixer 400 depicted in FIG. 4 is one possible embodiment of the mixer 100 depicted in FIG. 1.

However, the mixer 100 depicted in FIG. 1 is not limited to the embodiment shown in FIG. 4.

In the embodiment depicted in FIG. 4, the sample and hold circuit 404 includes a bridge switch, "ph1n_se," four sampling switches, "ph1p," "ph1n," "ph2p," "ph2n," and four capacitors, "C1p," "C1n," "C2p," and "C2n." The bridge switch, ph1n_se, is connected between the positive input terminal, mrx_p, and the negative input terminal, mrx_p. The switch, ph1p, is connected to the input terminal, mrx_p, and to the capacitor, C1p. The switch, ph1n, is connected to the input terminal, mrx_n, and to the capacitor, C1n. A first terminal of the bridge switch, ph1n_se, is connected to the input terminal, mrx_p, and to the switch, ph1p, while a second terminal of the bridge switch, ph1n_se, is connected to the switch, ph1n, to the capacitor, C1n, and to the switch, ph2n. The switch, ph2p, is connected to the switch, ph1p, to the capacitors, C1p, C2p, and to the output terminal, mix_out_p. The switch, ph2n, is connected to the switch, ph1n, to the capacitors, C1n, C2n, and to the output terminal, mix_out_n. The capacitors, C1p, C1n, C2p, and C2n, are connected to a mid-voltage node, "Vmid." The input terminal, mrx_n, may be connected to the node, Vmid, or left open if the input signal is a single-ended input signal. The switches, ph1p, ph1n, and ph1n_se, and the capacitors, C1p, and C1n, form a first sample and hold stage and the switches, ph2p, and ph2n, and the capacitors, C2p, and C2n, form a second sample and hold stage.

The mixer 400 can switch between different operational modes and support both single-ended and differential inputs. In the embodiment depicted in FIG. 4, the control unit 406 controls the switches, ph1p, ph1n, ph1n_se, ph2p, ph2n, of the sample and hold circuit 404 to switch the sample and hold circuit 404 between a single-ended input operational mode and a differential input operational mode. When a single-ended input signal is received at the input terminal, mrx_p, of the mixer, the control unit sets the sample and hold circuit to operate in the single-ended input operational mode. In the single-ended input operational mode, the switch, ph1n_se, is switched on (i.e., connected) and the switch, ph1n, is switched out (i.e., disconnected). Consequently, the parasitic capacitance at the input terminal, mrx_n, is switched out and does not act as an additional load during the single-ended input operational mode. When a differential input signal is received at the terminals, mrx_p, and, mrx_n, of the mixer, the control unit sets the sample and hold circuit to operate in the differential input operational mode. In the differential input operational mode, the switch, ph1n_se, is switched out (i.e., disconnected). In some embodiments, the clock/control output signals of the control unit are generated by a frequency divider, a clock delay buffer and logic circuits with differential input clock inputs (e.g., with a clock frequency that is equal to 2 times of the mixer input signal frequency), single ended clock inputs (e.g., with a clock frequency that is equal to 4 times of the mixer input signal frequency), and/or differential IQ clock inputs. The input clock signals to the control unit may be generated by one or more oscillators or frequency synthesizers. The control unit may receive an external instruction command that instructs the control unit to set the sample and hold circuit to the single-ended input operational mode or the differential input operational mode. For example, an element (e.g., the RF level detector 324 depicted in FIG. 3) that precedes the mixer in the input signal path may detect the input signal as being a differential input signal or a single-ended input signal and instructs the control unit to set the sample and hold circuit to the single-ended input operational mode or to the differential input operational mode.

Alternatively, the control unit may detect the input signal as being a differential input signal or a single-ended input signal itself (e.g., by monitoring the input terminals, mrx_p, and mrx_n) and set the sample and hold circuit to the single-ended input operational mode or the differential input operational mode.

Figure 5B:
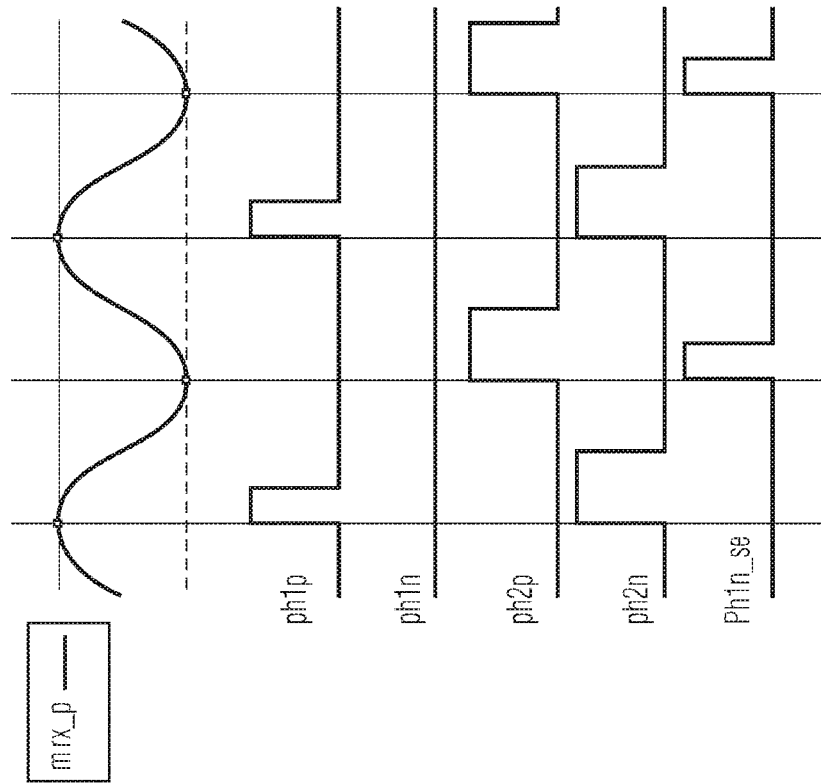
FIG. 5B illustrates clock sequences that can be used to set a sample and hold circuit of the mixer depicted in FIG. 4 in a single-ended input operational mode.
Figure 5A:
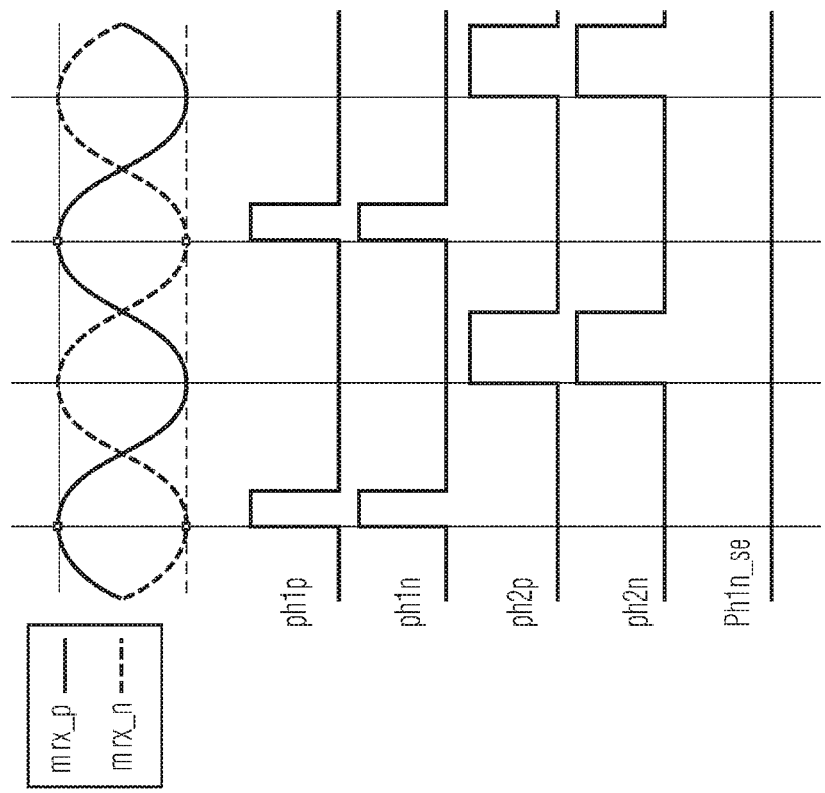
FIG. 5A illustrates clock sequences that can be used to set a sample and hold circuit of the mixer depicted in FIG. 4 in a differential input operational mode.

FIG. 5A illustrates clock sequences that can be used by the control unit 406 of the mixer 400 depicted in FIG. 4 to set the sample and hold circuit 404 in the differential input operational mode. When in the differential input operational mode, the switch, ph1n_se, is switched off (disconnected). The differential sampling pair of switches, ph1p, and ph1n, samples the differential input signal received at the input terminals, mrx_p, and mrx_n, at the same time with a narrow pulse (e.g., ⅛ of a clock period). After the signal sampling by the differential sampling pair of switches, ph1p, and ph1n, the capacitors, C1p, and C1n, are charged. The differential sampling pair of switches, ph2p, and ph2n, performs signal sampling at the same time with a broader pulse (e.g., ¼ of a clock period) and the voltage level of the capacitors, C1p, and C1n, are kept for a specific time duration (e.g., a half clock period). After the specific time duration, the charge stored in the capacitors, C1p, and C1n, is redistributed to the capacitors, C2p, and C2n, at the second sample and hold stage. When in the differential input operational mode, the mixer works as a low pass filter that filters un-wanted high frequency harmonics.

FIG. 5B illustrates clock sequences that can be used by the control unit 406 of the mixer 400 depicted in FIG. 4 to set the sample and hold circuit 404 in the single-ended input operational mode. When in the single-ended input operational mode, the switch, ph1n_se, is switched on (connected) and the switch, ph1n, is switched off (disconnected). The switch, ph1p, samples the single-ended input signal received at the input terminal, mrx_p, with a narrow pulse (e.g., ⅛ of a clock period). After the signal sampling, the capacitors, C1p, and C1n, are charged. The differential sampling pair of switches, ph2p, and ph2n, samples the single-ended input signal pseudo-differentially with a time difference of half a clock period. The voltage level of the capacitors, C1p, and C1n, are kept for a specific time duration (e.g., a half clock period). After the specific time duration, the charge stored in the capacitors, C1p, and C1n, is redistributed to the capacitors, C2p, and C2n, at the second sample and hold stage. Connecting the input terminals, mrx_p, and mrx_n, together may roughly double the capacitance, which is significant due to the additional blocks being connected to this input, e.g., chip PAD, ESD protection, RX protection, AGC(automatic gain/attenuator control circuits). However, the switch, ph1n_se, does not significantly increase the capacitive load at the input terminal, mrx_p, for single-ended operation. Lower input capacitance results in better system performance for parameters such as sensitivity, noise and power supply rejection ratio (PSRR).

In some embodiments, a negative input terminal, of the mixer 100 depicted in FIG. 1 is used for receiving single-ended input signals. FIG. 6 depicts an embodiment of the mixer 100 depicted in FIG. 1 in which a negative input terminal, mrx_n, is used for receiving single-ended input signals. In the embodiment depicted in FIG. 6, a mixer 600 includes the input unit 402 having two input terminals, mrx_p, mrx_n, a sample and hold circuit 604, a control unit 606, and the differential output unit 408 having two differential output terminals, mix_out_p, mix_out_n. The mixer 600 depicted in FIG. 6 is one possible embodiment of the mixer 100 depicted in FIG. 1. However, the mixer 100 depicted in FIG. 1 is not limited to the embodiment shown in FIG. 6.

In the embodiment depicted in FIG. 6, the sample and hold circuit 604 includes a bridge switch, "ph1p_se," four sampling switches, ph1p, ph1n, ph2p, ph2n, and four capacitors, C1p, C1n, C2p, and C2n. The bridge switch, ph1p_se, is connected between the positive input terminal, mrx_p, and the negative input terminal, mrx_p. The switch, ph1p, is connected to the input terminal, mrx_p, and to the capacitor, C1p. The switch, ph1n, is connected to the input terminal, mrx_n, and to the capacitor, C1n. A first terminal of the bridge switch, ph1p_se, is connected to the input terminal, mrx_n, and to the switch, ph1n, while a second terminal of the bridge switch, ph1p_se, is connected to the switch, ph1p, to the capacitor, C1p, and to the switch, ph2p. The switch, ph2p, is connected to the switch, ph1p, to the capacitors, C1p, C2p, and to the output terminal, mix_out_p. The switch, ph2n, is connected to the switch, ph1n, to the capacitors, C1n, C2n, and to the output terminal, mix_out_n. The capacitors, C1p, C1n, C2p, and C2n, are connected to a mid-voltage node, "Vmid." The input terminal, mrx_p, may be connected to the node, Vmid, or left open if the input signal is a single-ended input signal. The switches, ph1p, ph1n, and ph1p_se, and the capacitors, C1p, and C1n, form a first sample and hold stage and the switches, ph2p, and ph2n, and the capacitors, C2p, and C2n, form a second sample and hold stage.

The control unit 606 of the mixer 600 depicted in FIG. 6 controls the switches, ph1p, ph1n, ph1p_se, ph2p, ph2n, of the sample and hold circuit 604 to switch the sample and hold circuit between a single-ended input operational mode and a differential input operational mode. In the embodiment depicted in FIG. 6, the bridge switch, ph1p_se, is connected to the input terminal, mrx_n, to allow both a single-ended input signal and a differential input signal to be input into the input terminal, mrx_n.

Figure 7B:
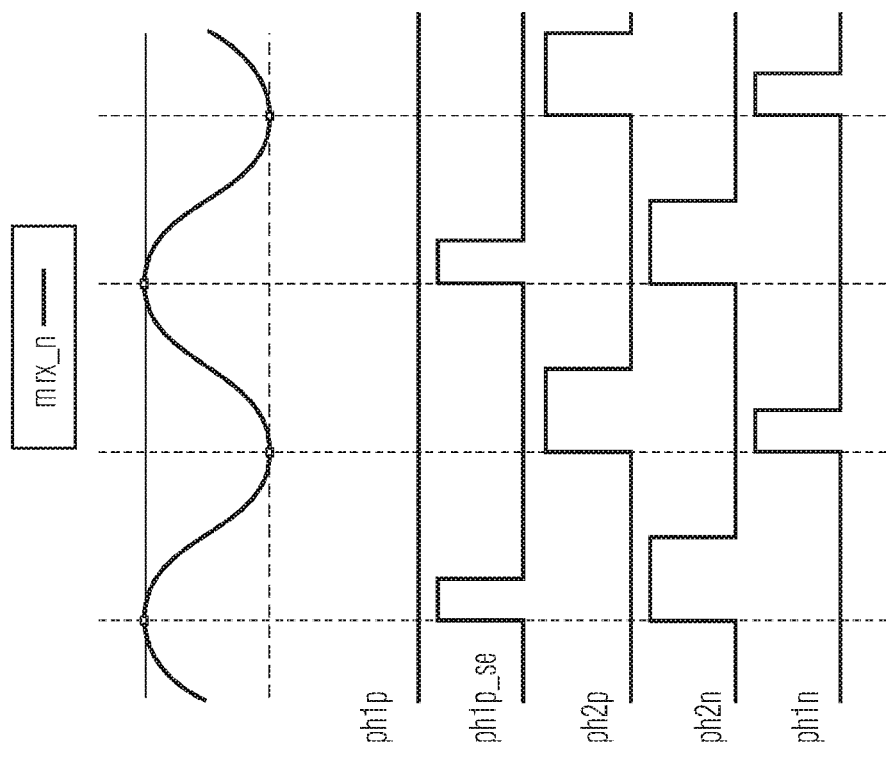
FIG. 7B illustrates clock sequences that can be used to set a sample and hold circuit of the mixer depicted in FIG. 6 in a single-ended input operational mode.
Figure 7A:
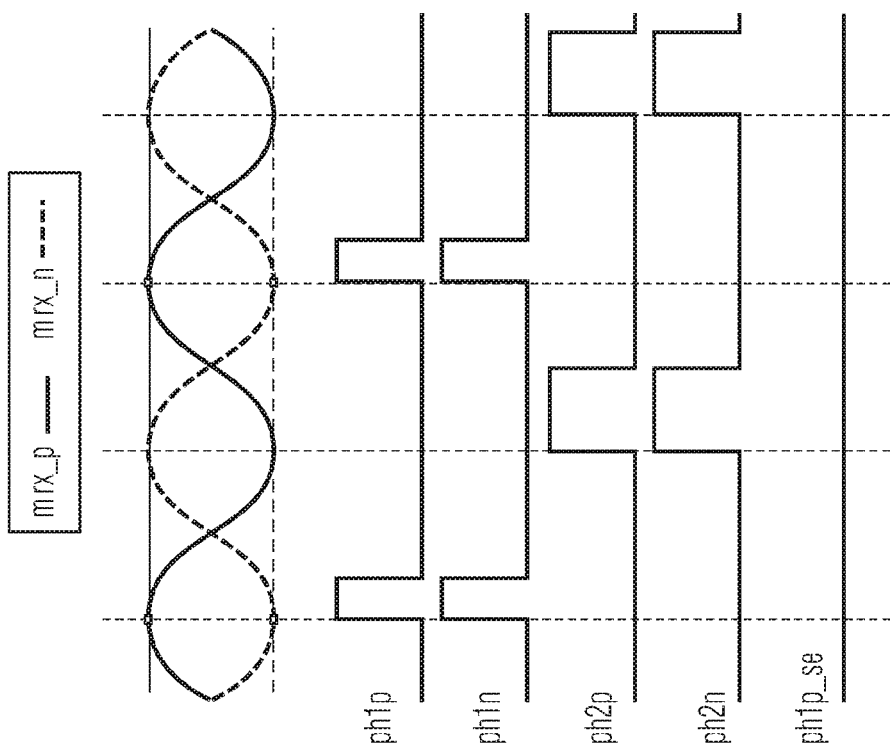
FIG. 7A illustrates clock sequences that can be used to set a sample and hold circuit of the mixer depicted in FIG. 6 in a differential input operational mode.

FIG. 7A illustrates clock sequences that can be used by the control unit 606 of the mixer 600 depicted in FIG. 6 to set the sample and hold circuit 604 in the differential input operational mode. When in the differential input operational mode, the switch, ph1p_se, is switched off (disconnected). The differential sampling pair of switches, ph1p, and ph1n, samples the differential input signal received at the input terminals, mrx_p, and mrx_n, at the same time with a narrow pulse (e.g., ⅛ of a clock period). After the signal sampling by the differential sampling pair of switches, ph1p, and ph1n, the capacitors, C1p, and C1n, are charged. The differential sampling pair of switches, ph2p, and ph2n, performs signal sampling at the same time with a broader pulse (e.g., ¼ of a clock period) and the voltage level of the capacitors, C1p, and C1n, are kept for a specific time duration (e.g., a half clock period). After the specific time duration, the charge stored in the capacitors, C1p, and C1n, is redistributed to the capacitors, C2p, and C2n, at the second sample and hold stage. When in the differential input operational mode, the mixer works as a low pass filter that filters un-wanted high frequency harmonics.

FIG. 7B illustrates clock sequences that can be used by the control unit 606 of the mixer 600 depicted in FIG. 6 to set the sample and hold circuit 604 in the single-ended input operational mode. When in the single-ended input operational mode, the switch, ph1p_se, is switched on (connected) and the switch, ph1p, is switched off (disconnected). The switch, ph1n, samples the single-ended input signal received at the input terminal, mrx_n, with a narrow pulse (e.g., ⅛ of a clock period). After the signal sampling, the capacitors, C1p, and C1n, are charged. The differential sampling pair of switches, ph2p, and ph2n, samples the single-ended input signal received at the input terminal, mrx_n, pseudo-differentially with a time difference of half a clock period. The voltage level of the capacitors, C1p, and C1n, are kept for a specific time duration (e.g., a half clock period). After the specific time duration, the charge stored in the capacitors, C1p, and C1n, is redistributed to the capacitors, C2p, and C2n, at the second sample and hold stage.

Figure 8:
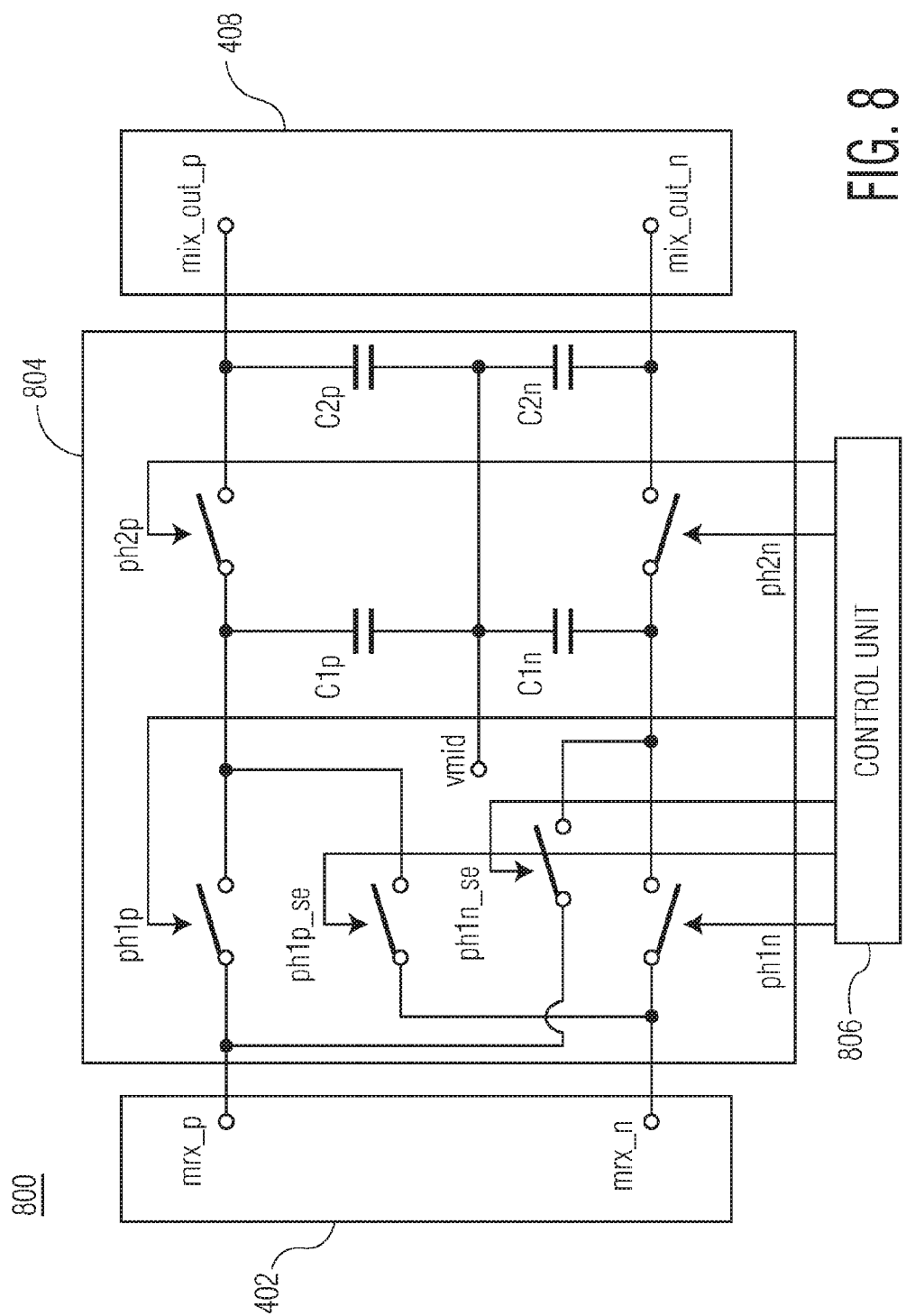
FIG. 8 depicts an embodiment of the mixer depicted in FIG. 1 in which both a positive input terminal and a negative input terminal of the mixer can be used for receiving single-ended input signals.

In some embodiments, both the positive input terminal and the negative input terminal of the mixer 100 depicted in FIG. 1 can be used for receiving single-ended input signals. FIG. 8 depicts an embodiment of the mixer 100 depicted in FIG. 1 in which both the positive input terminal and the negative input terminal of the mixer can be used for receiving single-ended inputs. In the embodiment depicted in FIG. 8, a mixer 800 includes the input unit 402 having two input terminals, mrx_p, mrx_n, a sample and hold circuit 804, a control unit 806, and the differential output unit 408 having two differential output terminals, mix_out_p, mix_out_n. The mixer 800 depicted in FIG. 8 is one possible embodiment of the mixer 100 depicted in FIG. 1. However, the mixer 100 depicted in FIG. 1 is not limited to the embodiment shown in FIG. 8.

A difference between the mixer 800 depicted in FIG. 8 and the mixer 400 depicted in FIG. 4 or the mixer 600 depicted in FIG. 6 is that the sample and hold circuit 804 of the mixer 800 includes two bridge switches, ph1p_se, ph1n_se, while the mixer 400 depicted in FIG. 4 or the mixer 600 depicted in FIG. 6 includes one bridge switch, ph1p_se, or ph1n_se. In addition to the two bridge switches, ph1p_se, ph1n_se, the sample and hold circuit 804 also includes four sampling switches, ph1p, ph1n, ph2p, ph2n, and four capacitors, C1p, C1n, C2p, and C2n.

The control unit 806 of the mixer 800 depicted in FIG. 8 controls the switches, ph1p, ph1n, ph1p_se, ph1n_se, ph2p, ph2n, of the sample and hold circuit 804 to switch the sample and hold circuit between a single-ended input operational mode and a differential input operational mode. In the embodiment depicted in FIG. 8, the bridge switch, ph1p_se, is connected to the negative input terminal, mrx_n, and the bridge switch, ph1n_se, is connected to the positive input terminal, mrx_p, to allow both a single-ended input signal and a differential input signal to be input into the negative input terminal, mrx_n or the positive input terminal, mrx_n. In some embodiments, the positive input terminal, mrx_p, is connected to a first node of an antenna network of the NFC receiver device 110, allowing optimum performance for use case A (e.g. reader mode) and the negative input terminal, mrx_n, is connected to another node of the antenna network, allowing optimum performance for use case B (e.g. card mode). Depending on the use case, the mixer 800 can switch between the input terminal, mrx_n, and the input terminal, mrx_p, for receiving single-ended input signals.

Figure 9:
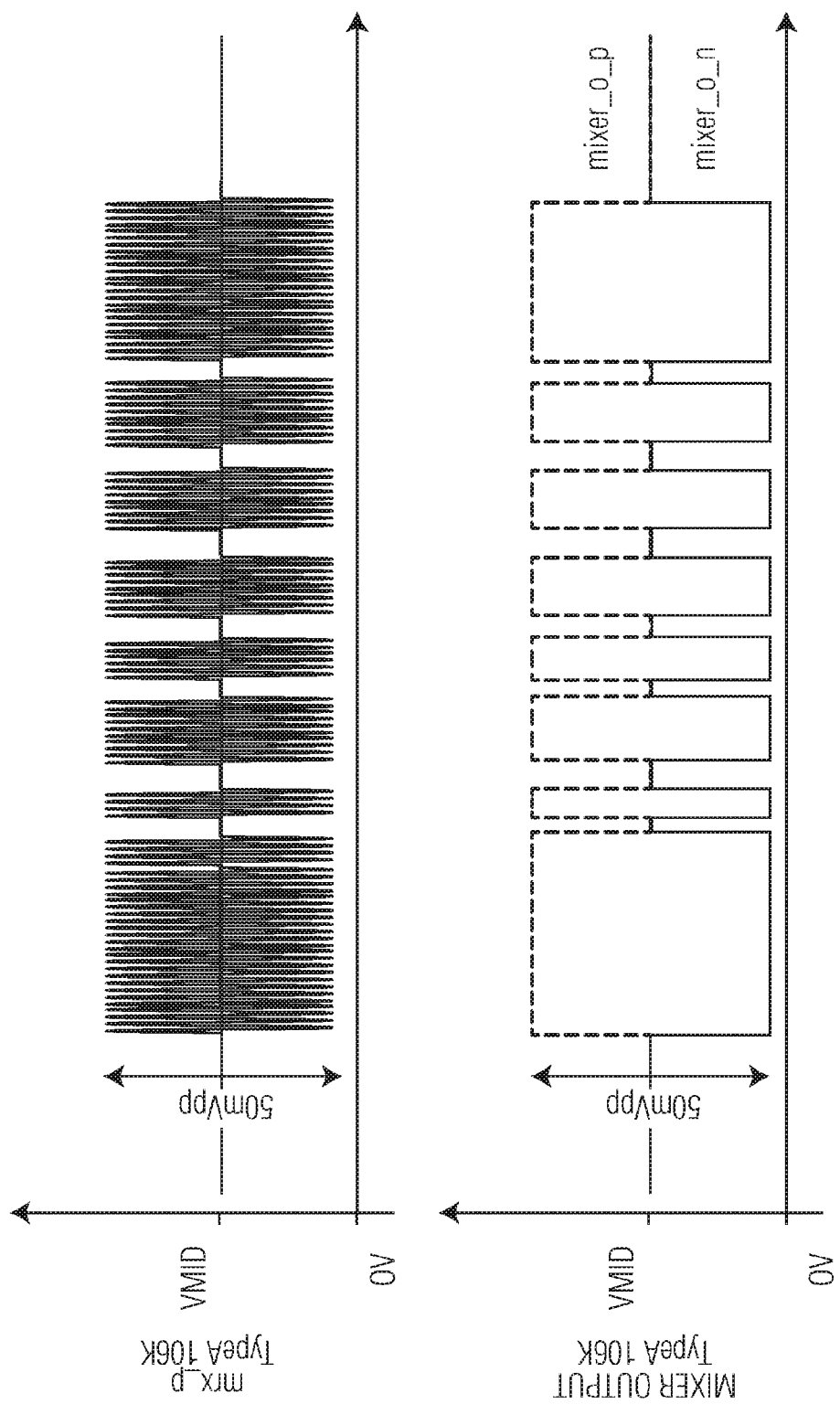
FIG. 9 illustrates some examples of the International Organization for Standardization (ISO)/the International Electrotechnical Commission (IEC) 14443 TypeA reader command input signals and differential output signals of the mixer depicted in FIG. 8.

FIG. 9 illustrates some examples of ISO/IEC 14443 TypeA reader command input signals and differential output signals of the mixer 800 depicted in FIG. 8. In the examples illustrated in FIG. 9, the input signal is a single-ended TypeA reader command signal that is received at the input terminal, mrx_p, with a carrier frequency of 13.56 MHz and an amplitude of 50 mV. $V_{MID}$ is a voltage level at half of supply voltage. The output signal is a symmetric differential envelop signal with a first differential component, mixer_o_p, and a second differential component, mixer_o_n.

Figure 10:
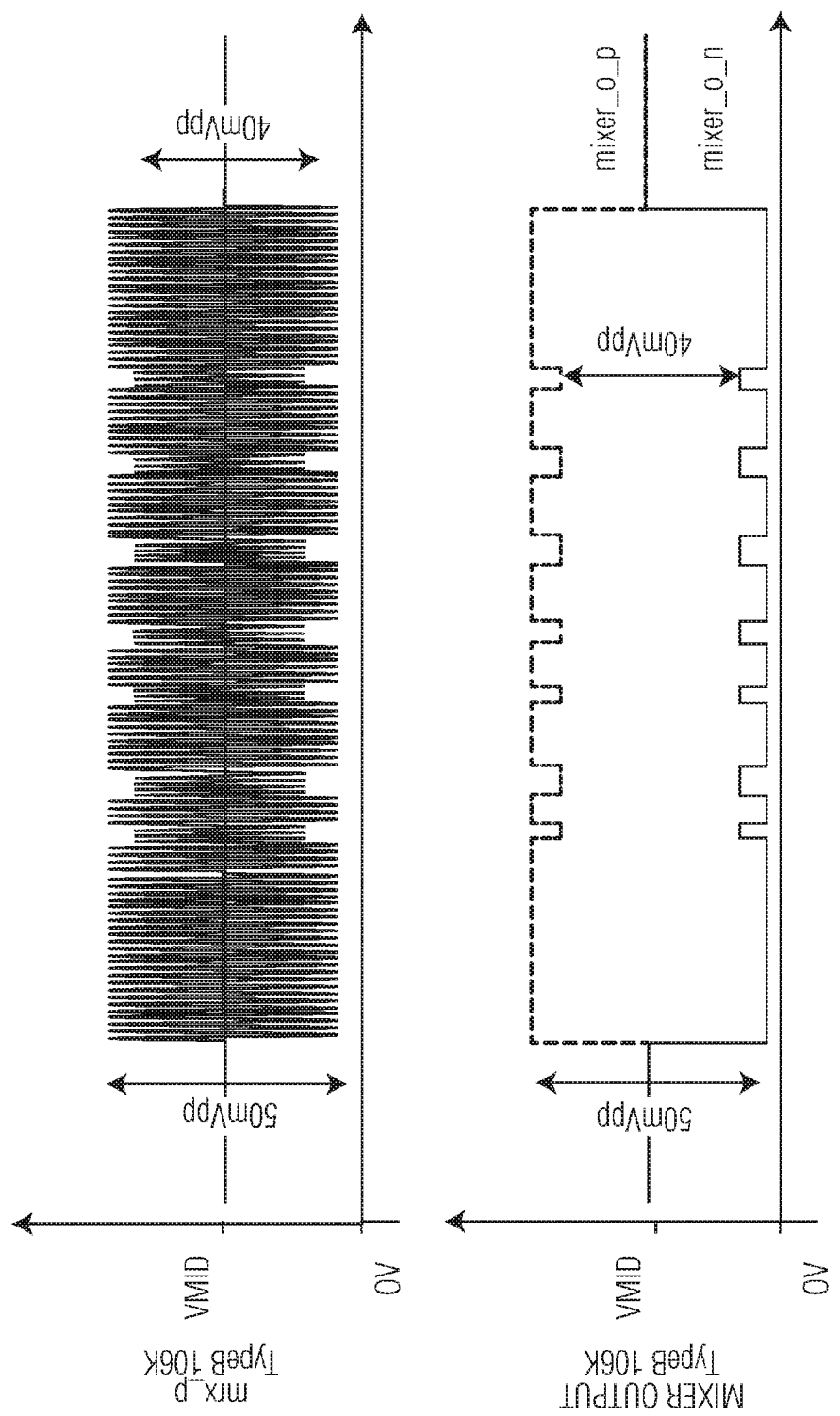
FIG. 10 illustrates some examples of ISO/IEC 14443 TypeB reader command input signals and differential output signals of the mixer depicted in FIG. 8.

FIG. 10 illustrates some examples of ISO/IEC TypeB reader command input signals and differential output signals of the mixer 800 depicted in FIG. 8. In the examples illustrated in FIG. 9, the input signal is a single-ended TypeB reader command signal that is received at the input terminal, mrx_p, with a carrier frequency of 13.56 MHz and an amplitude of 50 mV. $V_{MID}$ is a voltage level at half of supply voltage. The output signal is a symmetric differential envelop signal with a first differential component, mixer_o_p, and a second differential component, mixer_o_n.

In some embodiments, at least one of the switches, ph1p, ph1n, ph2p, ph2n, ph1p_se, ph1n_se of the mixers 400, 600, 800 depicted in FIGS. 4, 6, and 8 is implemented as a MOS switch, a MOS switch with a dummy transistor, a transition gate, or a combination of a MOS switch, a MOS switch with a dummy transistor, and/or a transition gate. FIGS. 11A-11D depict four embodiments of the switches, ph1p, ph1n, ph2p, ph2n, ph1p_se, and ph1n_se of the mixers 400, 600, and 800 depicted in FIGS. 4, 6, and 8. Switches depicted in FIGS. 11A-11D are four possible embodiments of the switches, ph1p, ph1n, ph2p, ph2n, ph1p_se, and ph1n_se depicted in FIGS. 4, 6, and 8. However, the switches, ph1p, ph1n, ph2p, ph2n, ph1p_se, and ph1n_se depicted in FIGS. 4, 6, and 8 are not limited to the embodiments shown in FIGS. 11A-11D.

Figure 11B:
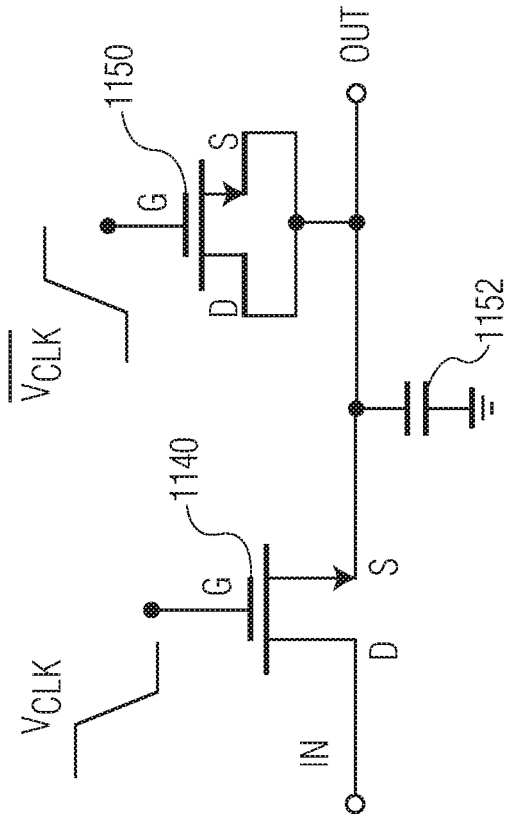
FIGS. 11A-11D depict four embodiments of switches of the mixers depicted in FIGS. 4, 6, and 8.
Figure 11A:
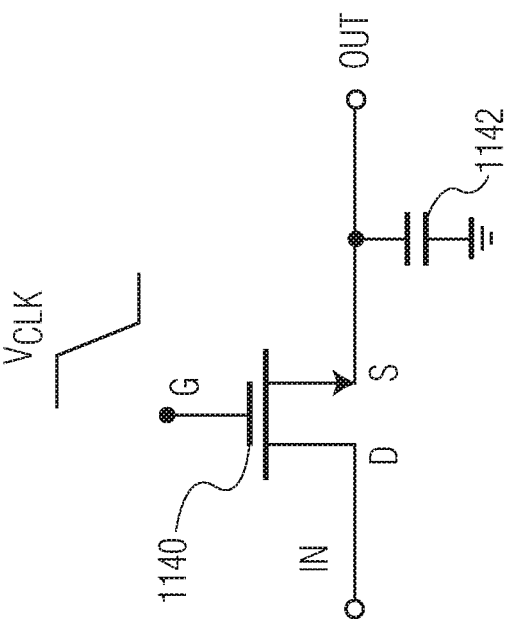

FIG. 11A depicts an embodiment of the switches, ph1p, ph1n, ph2p, ph2n, ph1p_se, ph1n_se depicted in FIGS. 4, 6 and 8 that is implemented as an NMOS switch 1140. In the embodiment depicted in FIG. 11A, the drain terminal, "D," of the NMOS switch is connected to an input terminal, "in," the gate terminal, "G," of the NMOS switch is connected to a voltage, $V_{CLK}$, and the source terminal, "S," of the NMOS switch is connected to an output terminal, "out." The NMOS switch has limited linear operating range. Current is discharged into a sampling capacitor 1142 when the NMOS switch is switched off.

FIG. 11B depicts an embodiment of the switches, ph1p, ph1n, ph2p, ph2n, ph1p_se, ph1n_se depicted in FIGS. 4, 6 and 8 that is implemented as an NMOS switch 1140 with a dummy switch 1150. In the embodiment depicted in FIG. 11B, the drain terminal, D, of the NMOS switch is connected to an input terminal, in, the gate terminal, G, of the NMOS switch is connected to a voltage, $V_{CLK}$, and the source terminal, S, of the NMOS switch is connected to an output terminal, out. Current is discharged into a sampling capacitor 1152 when the NMOS switch is switched off. The gate terminal, G, of the dummy switch 1150 is connected to a complementary voltage, $\overline{V_{CLK}}$, while the drain terminal, D, and the source terminal, S, of the dummy switch is connected to the output terminal, out. The dummy device achieves charge injection cancellation by switching in opposite phase, while still having limited linear operating range.

Figures 11C, 11D:
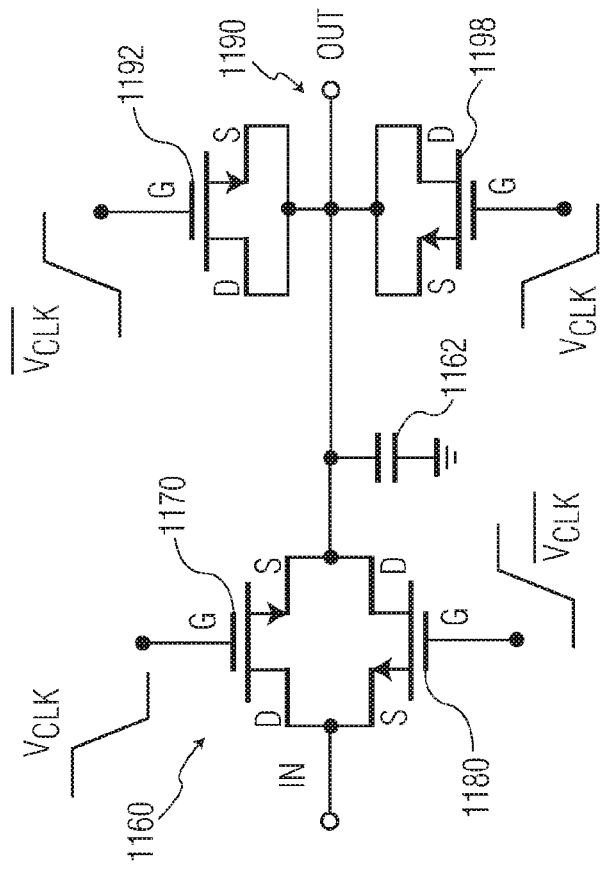

FIG. 11C depicts an embodiment of the switches, ph1p, ph1n, ph2p, ph2n, ph1p_se, ph1n_se depicted in FIGS. 4, 6 and 8 that is implemented as a complementary transition gate 1160. In the embodiment depicted in FIG. 11C, the complementary transition gate includes an NMOS transistor 1170 and a PMOS transistor 1180. The drain terminal, D, of the NMOS switch is connected to an input terminal, in, the gate terminal, G, of the NMOS switch is connected to a voltage, $V_{CLK}$, and the source terminal, S, of the NMOS switch is connected to an output terminal, out. Current is discharged into a sampling capacitor 1162 when the NMOS switch is switched off. The source terminal, S, of the PMOS switch is connected to the input terminal, in, the gate terminal, G, of the PMOS switch is connected to a complementary voltage, $\overline{V_{CLK}}$, and the drain terminal, D, of the PMOS switch is connected to the output terminal, out. Using complementary NMOS and PMOS transistors, the complementary transition gate can achieve charge injection cancellation and a rail to rail operating range.

FIG. 11D depicts an embodiment of the switches, ph1p, ph1n, ph2p, ph2n, ph1p_se, ph1n_se depicted in FIGS. 4, 6 and 8 that is implemented as the complementary transition gate 1160 with a dummy complementary transition gate 1190. In the embodiment depicted in FIG. 11D, the dummy transition gate includes an NMOS transistor 1192 and a PMOS transistor 1198. The drain terminal, D, and the source terminal, S, of the NMOS transistor 1192 are connected to the output terminal, out, while the gate terminal, G, of the NMOS switch 1192 is connected to the complementary voltage, $\overline{V_{CLK}}$. The drain terminal, D, and the source terminal, S, of the PMOS transistor 1198 are connected to the output terminal, while the gate terminal, G, of the PMOS transistor 1198 is connected to the complementary voltage, $\overline{V_{CLK}}$. Using complementary NMOS and PMOS transistors, the complementary transition gate can achieve charge injection cancellation and a rail to rail operating range.

Figure 12:
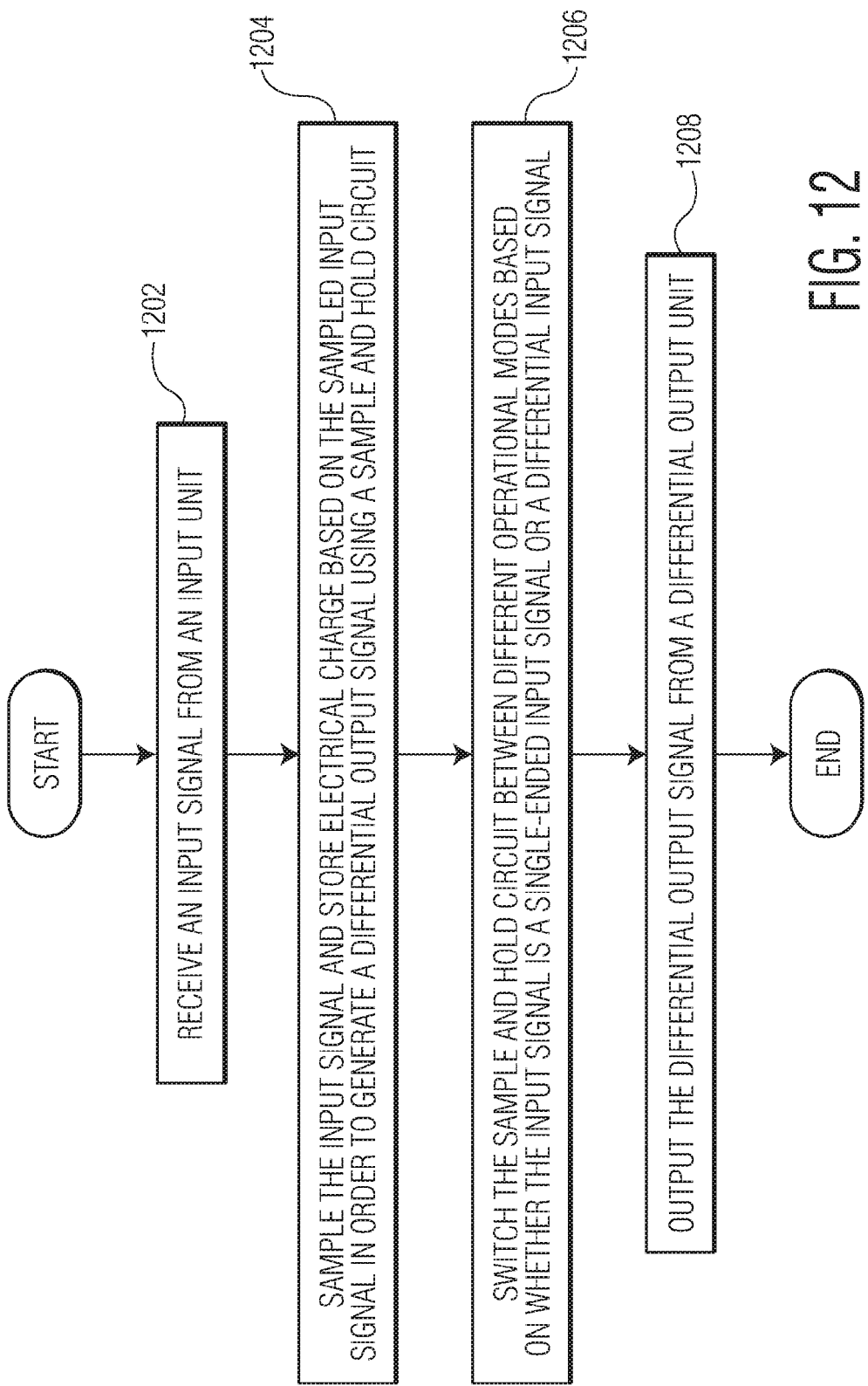
FIG. 12 is a process flow diagram of a method for operating a mixer of an NFC receiver device in accordance with an embodiment of the invention.

FIG. 12 is a process flow diagram of a method for operating a mixer of an NFC receiver device in accordance with an embodiment of the invention. At block 1202, which an input signal is received from an input unit. At block 1204, the input signal is sampled and electrical charge is stored based on the sampled input signal in order to generate a differential output signal using a sample and hold circuit. At block 1206, the sample and hold circuit is switched between different operational modes based on whether the input signal is a single-ended input signal or a differential input signal. At block 1208, the differential output signal is output from a differential output unit. The mixer may be the same or similar to the mixer 100 depicted in FIG. 1, the mixer 400 depicted in FIG. 4, the mixer 600 depicted in FIG. 6, and/or the mixer 800 depicted in FIG. 8.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A mixer of a Near field communication (NFC) receiver device, the mixer comprising:
    an input unit from which an input signal is received;
    a sample and hold circuit configured to sample the input signal and to store electrical charge based on the sampled input signal in order to generate a differential output signal;
    a control unit configured to switch the sample and hold circuit between different operational modes based on whether the input signal is a single-ended input signal or a differential input signal; and
    a differential output unit from which the differential output signal is output, wherein the control unit is configured to set the sample and hold circuit to a single-ended input operational mode in response to the input signal being a single-ended input signal and to set the sample and hold circuit to a differential input operational mode in response to the input signal being a differential input signal, wherein the input unit comprises a first input terminal and a second input terminal, wherein the sample and hold circuit comprises a first switch connected between the first input terminal and the second input terminal, wherein the differential output unit comprises a first output terminal and a second output terminal, and wherein the sample and hold circuit further comprises a second set of switches and a plurality of capacitors connected between the first and second input terminals and the first and second output terminals.

2. The mixer of claim 1, wherein the control unit is configured to control the first switch based on whether the input signal is a single-ended input signal or a differential input signal.

3. The mixer of claim 2, wherein the control unit is configured to switch the first switch on when in the single-ended input operational mode.

4. The mixer of claim 3, wherein the control unit is configured to switch the first switch off when in the differential input operational mode.

5. The mixer of claim 1, wherein the second set of switches comprises a second switch, a third switch, a fourth switch, and a fifth switch, wherein the plurality of capacitors comprise a first capacitor, a second capacitor, a third capacitor, and a fourth capacitor, wherein the second switch is connected to the first input terminal and to the first capacitor, and wherein the third switch is connected to the second input terminal and to the second capacitor.

6. The mixer of claim 5, wherein a first terminal of the first switch is connected to the first input terminal and to the second switch, wherein a second terminal of the first switch is connected to the third switch and to the second capacitor, and wherein the control unit is configured to switch the second switch off in response to the input signal being a single-ended input signal.

7. The mixer of claim 6, wherein the fourth switch is connected to the second switch, to the first capacitor, and to the first output terminal, and wherein the fifth switch is connected to the third switch, to the second capacitor, to the fourth capacitor, and to the second output terminal.

8. The mixer of claim 6, further comprising a sixth switch, wherein a first terminal of the sixth switch is connected to the second input terminal and to the third switch, wherein a second terminal of the sixth switch is connected to the second switch and to the first capacitor.

9. The mixer of claim 6, wherein the first, second, third, and fourth capacitors are connected to a node, and wherein the second input terminal is connected to the node if the input signal is a single-ended input signal.

10. The mixer of claim 1, wherein the mixer is an in-phase mixer or a quadrature mixer of an I/Q mixer system.

11. The NFC receiver device of claim 10, wherein the NFC receiver device further comprises the I/Q mixer system, an amplifier connected to the I/Q mixer system, an Analog to Digital Converter (ADC) connected to the amplifier, and a digital signal processor (DSP) connected to the ADC.

12. A method for operating a mixer of a Near field communication (NFC) receiver device, the method comprising:
    receiving an input signal from an input unit;
    sampling the input signal and storing electrical charge based on the sampled input signal in order to generate a differential output signal using a sample and hold circuit;
    switching the sample and hold circuit between different operational modes based on whether the input signal is a single-ended input signal or a differential input signal wherein switching the sample and hold circuit between the different operational modes comprises setting the sample and hold circuit to a single-ended input operational mode in response to the input signal being a single-ended input signal and setting the sample and hold circuit to a differential input operational mode in response to the input signal being a differential input signal; and
    outputting the differential output signal from a differential output unit, wherein the input unit comprises a first input terminal and a second input terminal, wherein the sample and hold circuit comprises a first switch connected between the first input terminal and the second input terminal, wherein the differential output unit comprises a first output terminal and a second output terminal, and wherein the sample and hold circuit further comprises a second set of switches and a plurality of capacitors connected between the first and second input terminals and the first and second output terminals.

* * * * *